United States Patent
Kao et al.

(10) Patent No.: US 9,136,828 B2
(45) Date of Patent: *Sep. 15, 2015

(54) CURRENT MODE LOGIC LATCH

(71) Applicant: Fujitsu Limited, Kanagawa (JP)

(72) Inventors: Shuo-Chun Kao, Sunnyvale, CA (US);
Nikola Nedovic, San Jose, CA (US)

(73) Assignee: Fujitsu Limited, Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/268,634

(22) Filed: May 2, 2014

(65) Prior Publication Data

US 2014/0240018 A1 Aug. 28, 2014

Related U.S. Application Data

(63) Continuation of application No. 13/495,786, filed on Jun. 13, 2012, now Pat. No. 8,736,334.

(51) Int. Cl.
*H03K 3/356* (2006.01)
*H03K 3/0233* (2006.01)

(52) U.S. Cl.
CPC .............. *H03K 3/356* (2013.01); *H03K 3/0233* (2013.01); *H03K 3/356043* (2013.01)

(58) Field of Classification Search
USPC .............. 327/55, 57, 199, 202, 203, 208, 327/210–212, 215, 218, 94, 95, 97; 326/115
See application file for complete search history.

(56) References Cited

U.S. PATENT DOCUMENTS

| | | | |
|---|---|---|---|
| 6,825,696 B2 | 11/2004 | Jaussi et al. | 327/55 |
| 7,336,114 B2* | 2/2008 | Razavi et al. | 327/199 |
| 7,388,406 B2 | 6/2008 | Chen | 326/115 |
| 8,736,334 B2* | 5/2014 | Kao et al. | 327/208 |
| 2003/0052720 A1 | 3/2003 | Tung et al. | 327/218 |
| 2007/0018693 A1* | 1/2007 | Chen | 326/115 |
| 2010/0013535 A1* | 1/2010 | Song et al. | 327/218 |

OTHER PUBLICATIONS

Usama et al.; "Design and comparison of CMOS current mode logic latches"; ISCAS 2004; IEEE, IV; pp. 353-356.
U.S. Office Action issued in U.S. Appl. No. 14/268,684, 8 pages, Nov. 17, 2014.

* cited by examiner

*Primary Examiner* — Long Nguyen
(74) *Attorney, Agent, or Firm* — Baker Botts L.L.P.

(57) ABSTRACT

A current mode logic latch may include a sample stage and a hold stage, the hold stage comprising first and second stage transistors, first and second hold stage current sources, and a hold stage switch. The first hold stage transistor may be coupled at its drain terminal to the drain terminal of a first sample stage transistor. The second hold stage transistor may be coupled at its drain terminal to the drain terminal of a second sample stage transistor, coupled at its gate terminal to the drain terminal of the first hold stage transistor, and coupled at its drain terminal to a gate terminal of the first hold stage transistor. The first hold stage current source may be coupled to a source terminal of the first hold stage transistor. The second hold stage current source may be coupled to a source terminal of the second hold stage transistor. The hold stage switch may be coupled between the source terminal of the first hold stage transistor and the source terminal of the second hold stage transistor.

12 Claims, 2 Drawing Sheets

CURRENT MODE LOGIC LATCH

CROSS-REFERENCE TO RELATED APPLICATION

The present application is a continuation application of copending U.S. patent application Ser. No. 13/495,786 filed Jun. 13, 2012, which is hereby incorporated by reference in its entirety for all purposes.

TECHNICAL FIELD

The present invention relates generally to electrical circuits, and more particularly, to current mode logic latches.

BACKGROUND

High-speed latches and flip-flops are useful in many applications (e.g., data sampling, clock deskew, etc.) in the electrical arts and are often an essential part of design of digital circuits. Various different structures and architectures have been proposed for high-speed latch and flip-flop designs, including static, dynamic, single phase, multiphase, clocked complementary metal-oxide-semiconductor (CMOS), transmission gate, and many others. Increasingly, circuit designers are employing current mode logic (CML) latches in their designs due to their superior performance at very high frequencies and other advantages as compared to other latch architectures.

An example of a traditional CML latch 100, as known in the art, is depicted in FIG. 1. A current mode logic latch typically comprises a sample stage 102, a hold stage 104, and a current source 106. Sample stage 102 may comprise transistors 108a, 108b, and 110, and drain resistors 112a and 112b. Each drain resistor 112a, 112b may be coupled between the drain terminal of a corresponding transistor 108a, 108b, respectively, and a high potential voltage source (e.g., $V_{DD}$). Each transistor 108a, 108b may in turn be coupled at its gate terminal to a differential input (e.g., $V_{in}^+$ or $V_{in}^-$) and at its source terminal to the drain terminal of transistor 110. Transistor 110 may be coupled at its gate terminal to a periodic clock signal CLK and coupled at its source terminal to current source 106.

Hold stage 104 may comprise transistors 114a, 114b, and 116. Each of transistors 114a, 114b may be coupled at its drain terminal to the drain terminal of a corresponding transistor 108a, 108b, respectively, and at its source terminal to the drain terminal of transistor 116. In addition, transistors 114a and 114b may be cross-coupled such that the gate terminal of transistor 114a is coupled to the drain terminal of transistor 114b, and vice versa.

In operation, sample stage transistors 108a, 108b form a differential transistor pair to sense and track the input data represented by an input voltage $V_{in}$, and cross-coupled hold stage transistors 114a, 114b form a differential transistor pair to store the sensed data. These differential pairs are switched by the complementary signals of the periodic clock signal CLK and CLK'. When CLK is of a high voltage potential (and CLK' is accordingly of a low voltage potential), substantially all of the current sourced by current source 106 passes through sample stage 102. On the other hand, when CLK is of a low voltage potential (and CLK' is accordingly of a high voltage potential), substantially all of the current sourced by current source passes through hold stage 104. Thus, the periodic clock signal CLK periodically enables and disables each of sample stage 102 and hold stage 104 in a complementary fashion (e.g., sample stage 102 is enabled while hold stage 104 is disabled, and vice versa).

The differential pair of sample stage 102 functions as a CML inverter, driven by complementary data signals. When $V_{in}$ is of a high voltage potential, substantially all of the current sourced by current source 106 passes through resistor 112a and transistor 108a and as a result, the voltage at the drain terminal of transistor 108a may obtain a low voltage potential (e.g., $V_{DD}-R_D I_{ss}$, where $R_D$ is the resistance of each of resistors 112a and 112b). At the same time, substantially no current passes through transistor 108b, and as a result, the voltage at the drain terminal of transistor 108b may obtain a high voltage potential (e.g., $V_{DD}$). Accordingly, CML latch 100 produces a differential output signal $V_{out}$ equal to the difference between the voltage potential at the drain terminal of transistor 108b (e.g., the node labeled "y" in FIG. 1) and voltage potential at the drain terminal of transistor 108a (e.g., the node labeled "x" in FIG. 1). The differential cross-coupled transistor pair of hold stage 104 forms a regenerative positive feedback structure which maintains $V_{out}$ during the time in which hold stage 104 is enabled by the complementary clock signal CLK'. FIG. 5 depicts example waveforms for $V_{in}$, CLK, and $V_{out}$ illustrating functionality of a CML latch.

Despite the advantages of conventional CML latches, in many technologies (e.g., submicron CMOS technologies), conventional CMOS latches may present voltage headroom problems. As an example, consider a submicron technology in which a typical power supply voltage $V_{DD}$ is 1.0V. Not uncommonly, a power supply may have 5% to 10% tolerance variations. Therefore, with a 1.0V $V_{DD}$, the worst case power supply may be 0.9V. In the circuit of FIG. 1, the output voltage swing is set exclusively by the amount of tail current ($I_{SS}$) and the value of the resistor load ($R_D$) and is generally much smaller than $V_{DD}$, in the order of a few hundred millivolts. Consider further that the CML latch is to be used in an application in which a single-ended-peak output swing of 0.2V is required. With a single-ended-peak output swing of 0.2V, the output common mode voltage of the latch circuit is 0.7V (e.g., $V_{DD}$-0.2V). The conventional CML latch 100 may suffers from severe voltage headroom problems when designed in a 1.0V (worst case 0.9V) supply voltage. When CLK is of a high voltage potential, the common-mode voltage at the inputs (e.g., $V_{in}^+$ and $V_{in}^-$) has to be sufficiently high enough to ensure that transistors 108a, 108b, and 110 and a transistor (not shown) of current source 106 are operated in saturation mode. Similarly, when CLK' is of a high voltage potential, the common-mode voltage at the outputs (e.g., $V_{out}^+$ and $V_{out}^-$) needs to drive transistors 114a, 114b, and 110 and a transistor (not shown) of current source 106 into saturation mode. Therefore, the common-mode voltage at both the inputs and the outputs need to satisfy the following relation:

$$V_{DD}-\text{Swing} > V_{CM} > V_{TH\text{-}NMOS} + 2V_{DSAT\text{-}NMOS}$$

where $V_{DD}$ is the supply voltage, Swing is the output voltage swing, $V_{CM}$ is the common mode voltage; $V_{TH\text{-}NMOS}$ is the threshold voltage of an NMOS transistor (e.g., transistor 108a, 108b, 110, 114a, 114b, 116 or a transistor of current source 106), which may, by way of example, be about 0.4 to 0.5V in a submicron technology; and $V_{DSAT\text{-}NMOS}$ is the saturation drain-to-source voltage of the NMOS transistor which may, by way of example, be about around 0.2V in a submicron technology. As a result, a $V_{CM}$ larger than at least 0.8V (0.4V+2*0.2V) is required to operate the latch circuit properly. With a worst case VDD of 0.9V and a single-ended-peak output swing of 0.2V (and therefore an output common-mode voltage of 0.7V), the output common-mode voltage may be insufficient to drive the transistors into saturation mode. The design may therefore suffer from severe voltage headroom problems. The latch circuit cannot acquire a wide input common-mode range, and the output swing of the latch circuit is small reducing the robustness of the circuit. In addition, with the tail current source in the triode region, the power supply rejection (i.e., rejection of noise from the power supply) may be poor resulting in noisy output waveforms.

Addressing these problems in submicron CMOS technologies may be difficult because the threshold voltage $V_{TH\text{-}NMOS}$ and the saturation drain-to-source voltage $V_{DSAT\text{-}NMOS}$ often do not shrink proportionately with reductions in the power supply. Removing current source 106 as depicted in FIG. 2 is one possible method of addressing the headroom issue, thus relying on transistors 110 and 116 to provide a tail current. With this proposed solution, however, the tail current would be inaccurate due to at least the uncertainty of the common-mode voltage and the voltage swing of the CLK and CLK' signals, which may results in an inaccurate output common-mode voltage as well as output swing. Also, with an inaccurate tail current, the transconductance of sample stage transistors 108a and 108b may vary significantly, requiring oversized transistors 108a and 108b for proper tracking operation. Another possible solution to address the headroom issue is to use low threshold voltage transistors. However, this requires extra mask steps in the manufacturing process that may not be available in a typical CMOS process. The extra mask steps to lower the threshold voltage also lay also render manufacturing costs prohibitively expensive.

SUMMARY

In accordance with some embodiments of the present disclosure, a current mode logic latch may include a sample stage and a hold stage. The sample stage may include a first sample stage transistor, a second sample stage transistor, a first resistor, a second resistor, a first sample stage current source, a second sample stage current source, and a sample stage switch. The first sample stage transistor may be coupled at its gate terminal to a first input terminal of the current mode logic latch. The second sample stage transistor may be coupled at its gate terminal to a second input terminal of the current mode logic latch, the first input terminal and the second input terminal comprising a differential voltage input. The first resistor may be coupled between a drain terminal of the first sample stage transistor and a high potential voltage source. The second resistor may be coupled between a drain terminal of the second sample stage transistor and the high potential voltage source. The first sample stage current source may be coupled to a source terminal of the first sample stage transistor. The second sample stage current source may be coupled to a source terminal of the second sample stage transistor. The sample stage switch may be coupled between the source terminal of the first sample stage transistor and the source terminal of the second sample stage transistor. The hold stage may comprise a first hold stage transistor, a second hold stage transistor, a first hold stage current source, a second hold stage current source, and a hold stage switch. The first hold stage transistor may be coupled at its drain terminal to the drain terminal of the first sample stage transistor. The second hold stage transistor may be coupled at its drain terminal to the drain terminal of the second sample stage transistor, coupled at its gate terminal to the drain terminal of the first hold stage transistor, and coupled at its drain terminal to a gate terminal of the first hold stage transistor. The first hold stage current source may be coupled to a source terminal of the first hold stage transistor. The second hold stage current source may be coupled to a source terminal of the second hold stage transistor. The hold stage switch coupled between the source terminal of the first hold stage transistor and the source terminal of the second hold stage transistor.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

The present disclosure may refer to the "size" of various types of transistors, including an n-type metal-oxide semiconductor field-effect transistor (NMOS). Unless otherwise specified, the description of a transistor's size, as used herein, describes the size parameter that affects the transconductance of the transistor. For example, for NMOS devices, "size" may refer to the width-to-length ratio of the gate and/or of the conducting channel of the device. Accordingly, a device that is described as being sized at a ratio as compared to another device may have a transconductance that is larger or smaller at that ratio as compared to the transconductance of the other device.

Further, the term "equivalent" may be used to describe two or more currents or two or more voltage potentials that may be designed to be approximately equal to each other. Though they may be designed to be approximately equal to each other, "equivalent" voltages, "equivalent" currents, or other "equivalent" items may include some variation due to factors including, but not limited to, device matching imperfections, semiconductor processing imperfections, and/or imbalanced operating conditions.

Figure 1:
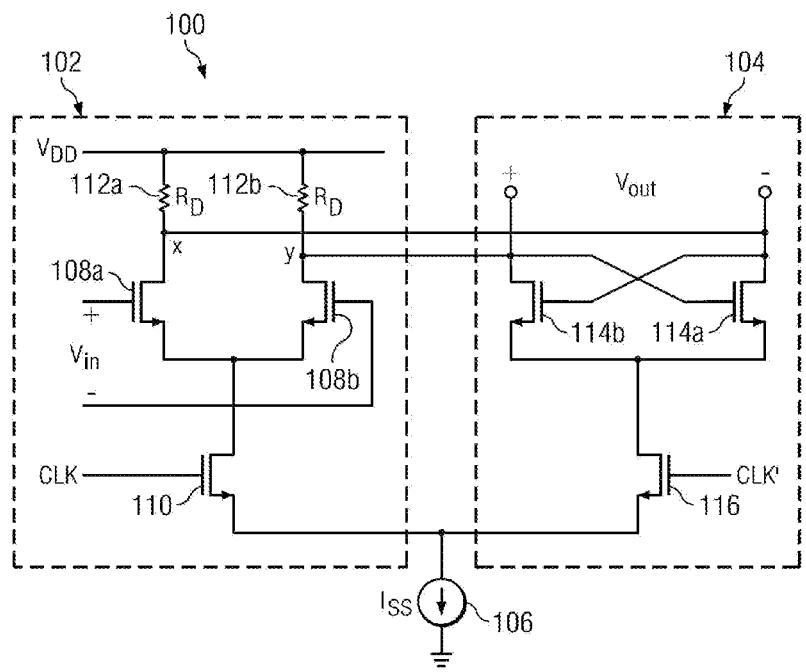
FIG. 1 illustrates a schematic diagram of an example current mode logic (CML) latch, as is known in the art.
Figure 2:
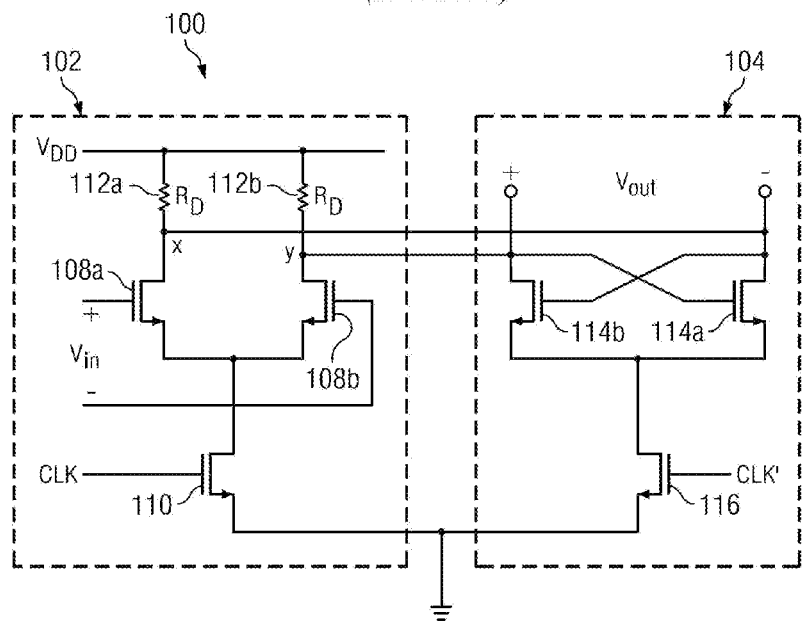
FIG. 2 illustrates a schematic diagram of another example CML latch, as is known in the art.
Figure 3:
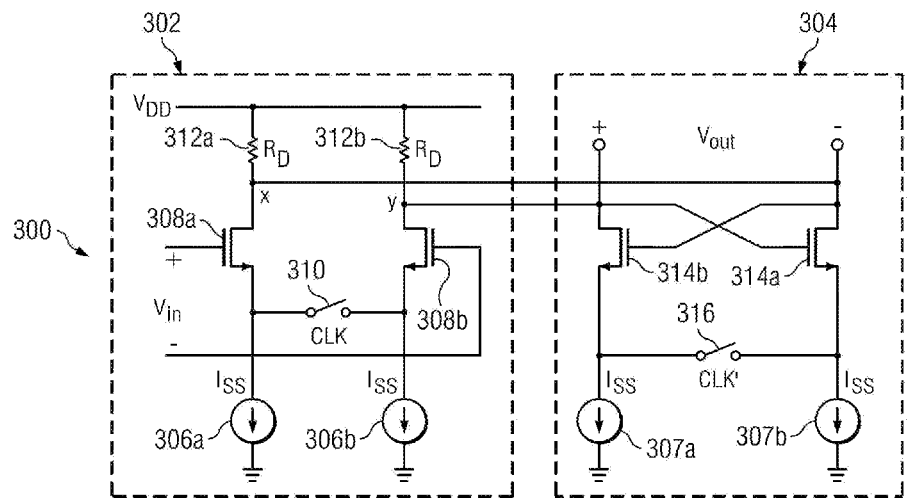
FIG. 3 illustrates a schematic diagram of an example CML latch employing a two-phase clock, in accordance with certain embodiments of the present disclosure.

FIG. 3 illustrates a schematic diagram of an example CML latch 300 employing a two-phase clock, in accordance with certain embodiments of the present disclosure. Power may be supplied to CML latch 300 through a high potential power supply and a low potential power supply. For the purposes of this disclosure, a high potential power supply may be referred to as "$V_{DD}$", and a low potential power supply may be referred to as "GND" or "$V_{SS}$".

As shown in FIG. 3, CML latch 300 may comprise a sample stage 302 and a hold stage 304. Sample stage 302 may comprise transistors 308a, 308b, a switch 310, resistors 312a, 312b, and current sources 306a, 306b. Each resistor 312a, 312b may be coupled between the drain terminal of a corresponding transistor 308a, 308b, respectively, and a high potential voltage source (e.g., $V_{DD}$). Transistors 308a, 308b may in turn be respectively coupled at their gate terminals to opposite polarities of a differential input (e.g., $V_{in}^+$ or $V_{in}^-$). In addition, each transistor 308a, 308b may be coupled at its source terminal to a corresponding current source 306a, 306b, respectively. In some embodiments, transistors 308a and 308b may be of approximately the same size. Switch 310 may be coupled between the source terminals of transistors 308a and 308b and may be enabled and disabled by a periodic clock signal (e.g., CLK).

Hold stage 304 may comprise transistors 314a, 314b, switch 316, and current sources 307a, 307b. Each of transistors 314a, 314b may be coupled at its drain terminal to the drain terminal of a corresponding sample stage transistor 308a, 308b, respectively. Furthermore, each transistor 314a, 314b may be coupled at its source terminal to a corresponding current source 307a, 307b, respectively. In addition, transistors 314a and 314b may be cross-coupled such that the gate terminal of transistor 314a is coupled to the drain terminal of transistor 314b, and vice versa. In some embodiments, transistors 314a and 314b may be of approximately the same size. Switch 316 may be coupled between the source terminals of transistors 314a and 314b and may be enabled and disabled by a periodic clock signal complementary to that enabling/disabling switch 310 (e.g., CLK').

In operation, sample stage transistors 308a, 308b form a differential transistor pair to sense and track the input data represented by an input voltage $V_{in}$, and cross-coupled hold stage transistors 314a, 314b form a differential transistor pair to store the sensed data. These differential pairs are switched by the complementary signals of the periodic clock signal CLK and CLK', such that the periodic clock signal CLK periodically enables and disables each of sample stage 302 and hold stage 304 in a complementary fashion (e.g., sample stage 302 is enabled while hold stage 304 is disabled, and vice versa).

The differential pair of sample stage 302 functions as a CML buffer, driven by complementary data signals. Such complementary data signals may themselves be CML signals. To illustrate operation of CML latch 300, consider that for a positive value of $V_{in}$, transistor 308a will experience a gate voltage of $V_{DD}$ (e.g., 0.9V) and transistor 308b will experience a gate voltage of $V_{DD}-V_{swing}$ (e.g., 0.9V−0.3V=0.6V), where $V_{swing}$ is the voltage swing at $V_{in}$. When $V_{in}$ is positive and sample stage 302 is enabled (e.g., CLK is high), switch 310 is closed and current sources 306a and 306b are combined. The voltage at the drain terminal of transistor 308a (denoted as node x is FIG. 3), may obtain a voltage $V_x=V_{DD}-R_D I_{SS\_306}-I_{SS\_307b}R_D$, where $I_{SS\_306}$ is the sum of the currents of current sources 306a and 306b ($I_{SS\_306}=I_{SS\_306a}+I_{SS\_306b}$). In addition, the voltage of drain terminal of transistor 308b (denoted as node y in FIG. 3), may obtain a voltage $V_y=V_{DD}-I_{SS\_307a}R_D$. As a specific example, consider $R_D=150\Omega$, $I_{SS\_306a}=I_{SS\_306b}=I_{SS\_307a}=I_{SS\_307b}=0.5$ mA. In such a case, with $V_{in}$ positive and sample stage 302 enabled, $V_x=0.675V$ and $V_y=0.825V$. If, on the other hand, $V_{in}$ is negative, $V_x=0.825V$ and $V_y=0.675V$.

When CLK is low and hold stage 304 is enabled, hold stage 304 will hold the value at nodes x and y regardless of the value at $V_{in}$. Continuing the numerical example from above, assume CLK goes from high to low when $V_x=0.75V$ and $V_y=0.6V$. At such time, switch 316 may close, and current sources 307a and 307b are effectively combined. Because $V_x$ is a higher potential than $V_y$, transistor 314b will source more current than transistor 314a. Assuming that transistor 314b sources 1.75 mA of the total 2 mA of current of transistors 307a and 307b, $V_x=V_{DD}-(I_{SS\_306}+0.25$ mA$)R_D=0.785V$ and $V_y=V_{DD}-(I_{SS\_306}+1.75$ mA$)R_D=0.562V$. Thus, for this particular numerical example, the sampled signal having a voltage swing of 0.15V on the output of CML latch 300 during the sample stage may have an output voltage swing of 0.785V−0.562V=0.223V during the hold stage. Thus, depending on device sizes, current levels, and other parameters chosen for design, the swing levels in the sample stage and the hold stage may vary.

Although FIG. 3 depicts that sample stage 302 is enabled while clock signal CLK is of a high voltage potential and hold stage 304 is enabled while clock signal CLK is of a low voltage potential, other embodiments in which sample stage 302 is enabled while clock signal CLK is of a low voltage potential and hold stage 304 is enabled while clock signal CLK is of a high voltage potential are contemplated herein.

In addition, although FIG. 3 depicts current sources 306a, 306b, 307a, and 307b all generating tail currents equal to $I_{SS}$, other embodiments in which currents generated by current sources 306a and 306b may be substantially different than those generated by current sources 307a and 307b.

Figure 5:
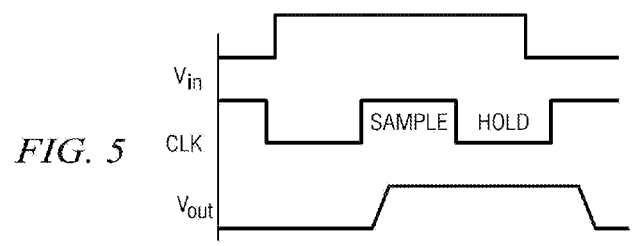
FIG. 5 illustrates example waveforms depicting example functionality of both traditional CML latches and improved CML latches disclosed herein.

Simulations confirm that CML latch 300 possesses operational characteristics substantially similar to that of traditional CML latches (e.g., CML latch 300 performs substantially in accordance with the waveforms depicted in FIG. 5). However, the topology of CML latch 300, when compared to traditional CML latches, effectively removes one transistor between the path between VDD and GND, thus potentially improving voltage headroom while ensuring tail current sources (current sources 306a, 306b, 307a, and 307b) remain in saturation.

Figure 4:
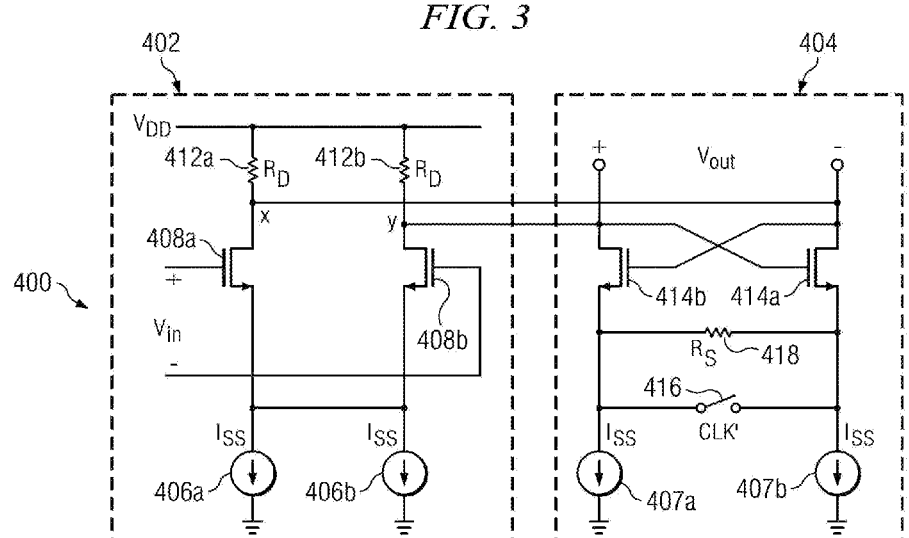
FIG. 4 illustrates a schematic diagram of another improved example CML latch employing a single-phase clock, in accordance with certain embodiments of the present disclosure.

FIG. 4 illustrates a schematic diagram of an example CML latch 400 employing a single-phase clock, in accordance with certain embodiments of the present disclosure. Power may be supplied CML latch 400 through a high potential power supply and a low potential power supply.

As shown in FIG. 4, CML latch 400 may comprise a sample stage 402 and a hold stage 404. Sample stage 402 may comprise transistors 408a, 408b, resistors 412a, 412b, and current sources 406a, 406b. Each resistor 412a, 412b may be coupled between the drain terminal of a corresponding transistor 408a, 408b, respectively, and a high potential voltage source (e.g., $V_{DD}$). Transistors 408a, 408b may in turn be respectively coupled at their gate terminals to opposite polarities of a differential input (e.g., $V_{in}^+$ or $V_{in}^-$). In addition, each transistor 408a, 408b may be coupled at its source terminal to a corresponding current source 406a, 406b, respectively. Furthermore, transistors 408a, 408b may be coupled to each other at their source terminals. In some embodiments, transistors 408a and 408b may be of approximately the same size. In some embodiments, current sources 406a and 406b may be combined into a single current source.

Hold stage 404 may comprise transistors 414a, 414b, switch 416, resistor 418 and current sources 407a, 407b. Each of transistors 414a, 414b may be coupled at its drain terminal to the drain terminal of a corresponding sample stage transistor 408a, 408b, respectively. Furthermore, each transistor 414a, 414b may be coupled at its source terminal to a corresponding current source 407a, 407b, respectively. In addition, transistors 414a and 414b may be cross-coupled such that the gate terminal of transistor 414a is coupled to the drain terminal of transistor 414b, and vice versa. In some embodiments, transistors 414a and 414b may be of approximately the same size. Switch 416 may be coupled between the source terminals of transistors 414a and 414b and may be enabled and disabled by a periodic clock signal (e.g., CLK or CLK'). Resistor 418 may have a resistance $R_S$ and may be coupled between the source terminals of transistors 414a and 414b.

In operation, sample stage transistors 408a, 408b form a differential transistor pair to sense and track the input data represented by an input voltage $V_{in}$, and cross-coupled hold stage transistors 414a, 414b form a differential transistor pair to store the sensed data. The differential pair of sample stage 402 functions as a CML inverter, driven by complementary data signals.

Periodic enabling and disabling of switch 416 by a periodic clock signal (e.g. CLK or CLK') may have the effect of periodically changing the effective load resistance seen at the output terminals of CML latch 400. If the transconductances of transistors 408a, 408b, 412a, and 412b (and thus, the overall transconductance of CML latch 400) and/or resistance $R_S$ of resistor 418 is appropriately tuned, the effective load resistance may be configured such that it has a positive effective resistance when switch 416 is disabled and a negative effective resistance when switch 416 is enabled. Thus, in a sample mode in switch 416 is disabled, the positive effective resistance may leads to amplification of an input signal. On the other hand, in a hold mode in which switch 416 is enabled, the negative resistance may lead to positive feedback at the output and permit components of hold stage 404 to outdrive components of sample stage 402, thus permitting hold stage 404 to maintain a sampled signal at the output of CML latch 400.

To further illustrate, those of skill in the art may appreciate that the effective load resistance $R_L$ as seen at the output $V_{out}$ of CML latch 400 may be given by:

$$R_L = R_D/(1 - G_m \cdot R_D)$$

where $R_D$ is the resistance of resistors 412a, 412b and $G_m$ is the effective transconductance as seen at the output $V_{out}$ of CML latch 400. The transconductance may be given by:

$$G_m = g_{m2}/(1 + g_{m2} \cdot R_S/2); \text{ when switch 416 is disabled; and}$$

$$G_m = g_{m2}; \text{ when switch 416 is enabled; and}$$

where $g_{m2}$ is the transconductance of each transistor 414a and 414b. Thus, by selecting appropriate values of $g_{m2}$, $R_D$, and/or $R_S$, CML latch 400 can be configured such that the output load resistance is positive when switch 416 is disabled and negative when switch 416 is enabled.

Although FIG. 4 depicts that switch 416 is enabled while clock signal CLK is of a low voltage potential and vice versa, other embodiments in which switch 416 is enabled while clock signal CLK is of a high voltage potential are contemplated herein.

In addition, although FIG. 4 depicts current sources 406a, 406b, 407a, and 407b all generating tail currents equal to $I_{SS}$, other embodiments in which currents generated by current sources 406a and 406b may be substantially different than those generated by current sources 407a and 407b.

Simulations confirm that CML latch 400 possesses operational characteristics substantially similar to that of traditional CML latches (e.g., CML latch 400 performs substantially in accordance with the waveforms depicted in FIG. 5). However, the topology of CML latch 400, when compared to traditional CML latches, effectively removes one transistor between the path between VDD and GND, thus potentially improving voltage headroom while ensuring tail current sources (current sources 406a, 406b, 407a, and 407b) remain in saturation. In addition, use of a single-phase clock may eliminate clock skew that may occur in the case of a latch using a differential clock.

As used herein, a current source (e.g., current source 306a, 306b, 307a, 307b, 406a, 406b, 407a, and/or 407d) may include any electrical or electronic device configured to deliver or absorb electric current.

As used herein, a switch (e.g., switch 310, 316, and/or 416) may comprise any system, device, or apparatus configured to selectively break or close an electrical path based on a received control signal, thus disabling or enabling the flow of current through the switch. A switch is considered to be enabled when it is selected to enable flow of current, and considered to be disabled when it is selected to disable flow of current. A switch may be implemented in any suitable fashion, including, without limitation, as a transistor or a transmission gate comprising a plurality of transistors.

As used herein, a transistor (e.g., transistor 308a, 308b, 314a, 314b, 408a, 408b, 414a, and/or 414b) may comprise any system, device, or apparatus configured to control a signal at a pair of its terminals by a signal applied to another pair of its terminals. Although the FIGURES of this disclosure depicts transistors as n-type complementary metal-oxide-semiconductor field-effect transistors, transistors may include any other suitable type of transistor (e.g., n-type complementary metal-oxide-semiconductor field-effect transistors, bipolar junction transistors, junction-gate field effect transistors, insulated gate bipolar transistors, etc.).

As used herein, a resistor (e.g., resistor 312a, 312b, 412a, 412b, 418) may comprise any electronic component that produces a voltage across its terminals that is proportional to the electric current passing through it in accordance with Ohm's law.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could me made hereto without departing from the spirit and scope of the invention.

What is claimed is:
1. A latch, comprising:
 a sample stage configured to alternate between a first phase and a second phase of the latch, the sample stage comprising:
  a sample-stage switch configured to be closed during the first phase and to be open during the second phase; and
  a first pair of transistors, the first pair of transistors configured as a differential pair when the sample-stage switch is closed, and configured as separately biased transistors when the sample-stage switch is open; and
 a hold stage configured to alternate between the first phase and the second phase of the latch, the hold stage comprising:
  a hold-stage switch configured to be open during the first phase and to be closed during the second phase; and
  a second pair of transistors, the second pair of transistors configured as a cross-coupled differential pair when the hold-stage switch is closed, and configured as separately biased cross-coupled transistors when the hold-stage switch is open.

2. The latch of claim 1, further comprising a first current source and a second current source configured to bias the first pair of transistors during the first phase and during the second phase.

3. The latch of claim 1, further comprising a third current source and a fourth current source configured to bias the second pair of transistors during the first phase and during the second phase.

4. The latch of claim 1, wherein the first pair of transistors and the second pair of transistors comprise metal-oxide-semiconductor (MOS) transistors.

5. The latch of claim 4, wherein:
the first pair of transistors of the sample stage comprises a first transistor and a second transistor;
a drain of the first transistor is coupled a first load device;
a drain of the second transistor is coupled to a second load device;
the second pair of transistors of the hold stage comprises a third transistor and a fourth transistor;
a drain of the fourth transistor and a gate of the third transistor are coupled to the first load device; and
a drain of the third transistor and a gate of the fourth transistor are coupled to the second load device.

6. The latch of claim 5, wherein the first load device is a first load resistor and the second load device is a second load resistor.

7. The latch of claim 1, wherein a transconductance of the sample stage is larger during the first phase than during the second phase.

8. The latch of claim 1, wherein a transconductance of the hold stage is larger during the second phase than during the first phase.

9. The latch of claim 1, wherein, during the first phase, a transconductance of the sample stage is larger than a transconductance of the hold stage.

10. The latch of claim 9, wherein, during the first phase, the transconductance of the hold stage is approximately zero.

11. The latch of claim 1, wherein, during the second phase, a transconductance of the hold stage is larger than a transconductance of the sample stage.

12. The latch of claim 11, wherein, during the second phase, the transconductance of the sample stage is approximately zero.

* * * * *